US008861232B2

(12) United States Patent
Ikeda et al.

(10) Patent No.: US 8,861,232 B2
(45) Date of Patent: Oct. 14, 2014

(54) CURRENT-SENSING CIRCUIT AND AIR-CONDITIONING DEVICE PROVIDED THEREWITH

(75) Inventors: Motonobu Ikeda, Sakai (JP); Satoshi Yagi, Sakai (JP); Ryousuke Yamamoto, Sakai (JP)

(73) Assignee: Daikin Industries, Ltd., Osaka (JP)

( * ) Notice: Subject to any disclaimer, the term of this patent is extended or adjusted under 35 U.S.C. 154(b) by 380 days.

(21) Appl. No.: 13/264,405

(22) PCT Filed: Mar. 18, 2010

(86) PCT No.: PCT/JP2010/001932
§ 371 (c)(1),
(2), (4) Date: Oct. 14, 2011

(87) PCT Pub. No.: WO2010/119619
PCT Pub. Date: Oct. 21, 2010

(65) Prior Publication Data
US 2012/0048520 A1    Mar. 1, 2012

(30) Foreign Application Priority Data
Apr. 17, 2009 (JP) .................... 2009-101350

(51) Int. Cl.
*H02H 7/122* (2006.01)
*G01R 19/00* (2006.01)

(52) U.S. Cl.
CPC .................... *G01R 19/0092* (2013.01)
USPC ........................................... 363/55

(58) Field of Classification Search
CPC .................................. G01R 12/0092
USPC ......... 363/55; 324/549, 764.01; 318/801, 802
See application file for complete search history.

(56) References Cited

U.S. PATENT DOCUMENTS 5,689,162 A * 11/1997 Li ..................... 318/599
6,469,491 B1 * 10/2002 Schultz ................ 324/120
7,031,855 B2 * 4/2006 Mottola ............... 702/64

FOREIGN PATENT DOCUMENTS

| JP | 63-23659 U | 2/1988 |
| JP | 4-244734 A | 9/1992 |
| JP | 10-132861 A | 5/1998 |

* cited by examiner

*Primary Examiner* — Matthew Nguyen
(74) *Attorney, Agent, or Firm* — Birch, Stewart, Kolasch & Birch, LLP

(57) ABSTRACT

The current-sensing circuit (1) includes a shunt resistor (R1) connected in series with a path of current from an inverter (106), an operational amplifier (12) amplifying voltage across both ends of this shunt resistor (R1) with a predetermined gain, a low-pass filter (18) averaging output voltage of this operational amplifier (12), and an arithmetic unit (50) calculating the current flowing through the path based on output voltage of the low-pass filter (18). The supply voltage of the operational amplifier (12) is set higher than the supply voltage of the arithmetic unit (50). The output voltage of the operational amplifier (12) is averaged at the low-pass filter (18) to a lower value than the supply voltage of the arithmetic unit (50).

4 Claims, 5 Drawing Sheets

CURRENT-SENSING CIRCUIT AND AIR-CONDITIONING DEVICE PROVIDED THEREWITH

TECHNICAL FIELD

The present invention relates to a current-sensing circuit and an air-conditioning device provided therewith.

BACKGROUND ART

Current-sensing circuits using operational amplifiers have been proposed as a technique for sensing electrical current from an inverter. In this current-sensing circuit, output voltage of the operational amplifier is input to a microcomputer, which calculates the current value from this output voltage. In such a current-sensing circuit, variations in the supply voltage of the microcomputer to which output voltage of the operational amplifier is input, LSB (Least Significant Bit) errors of the microcomputer, and resistance errors and the like cause errors in this current value. The lower the output voltage of the operational amplifier input to the microcomputer is, the larger such errors become.

Patent Document 1, for example, discloses a current-sensing circuit that employs an operational amplifier, in which the gain is variable based on the level of a current command value (so-called "reference voltage") that controls the inverter. This current-sensing circuit sets a low gain when the current command value is large so as to be able to detect a high current flow, while it sets a high gain when the current command value is small so as to increase the current sensing resolution.

Patent Document 1: Japanese Patent Application Laid-open No. H10-132861

However, since the current from the inverter detected at the current-sensing circuit of the above-mentioned Patent Document 1 has a pulse wave form, the output voltage of the operational amplifier also has a pulse wave form. An expensive microcomputer with high arithmetic performance is necessary if such pulse-wave output voltage is to be input to the microcomputer to perform the arithmetic operation. Furthermore, since the current-sensing circuit of Patent Document 1 has a circuit configuration in which the current command value is input to a comparator and the gain is changed based on output from this comparator, the circuit requires additional circuit components such as the comparator, which leads to an increase in cost.

SUMMARY OF THE INVENTION

Accordingly, the present invention was devised in view of the foregoing, and an object of the invention is to provide an inexpensive current-sensing circuit with high current sensing accuracy, and an air-conditioning device provided therewith.

The current-sensing circuit of the present invention is a circuit for sensing current from an inverter (106). This current-sensing circuit includes a shunt resistor (R1) connected in series with a path of the current from the inverter (106); an operational amplifier (12) amplifying voltage across both ends of the shunt resistor (R1) with a predetermined gain; an average voltage generating unit (18) averaging output voltage of the operational amplifier (12) to generate an average voltage (V1); and an arithmetic unit (50) calculating the current flowing through the path based on the average voltage (V1) output from the average voltage generating unit (18). The supply voltage of the operational amplifier (12) is set higher than the supply voltage of the arithmetic unit (50). The output voltage of the operational amplifier (12) is averaged at the average voltage generating unit (18) to a lower value than the supply voltage of the arithmetic unit (50).

DESCRIPTION OF EMBODIMENTS

Hereinafter, one embodiment of the present invention will be described in detail with reference to the drawings.

<Air-conditioning Device>

Figure 1:
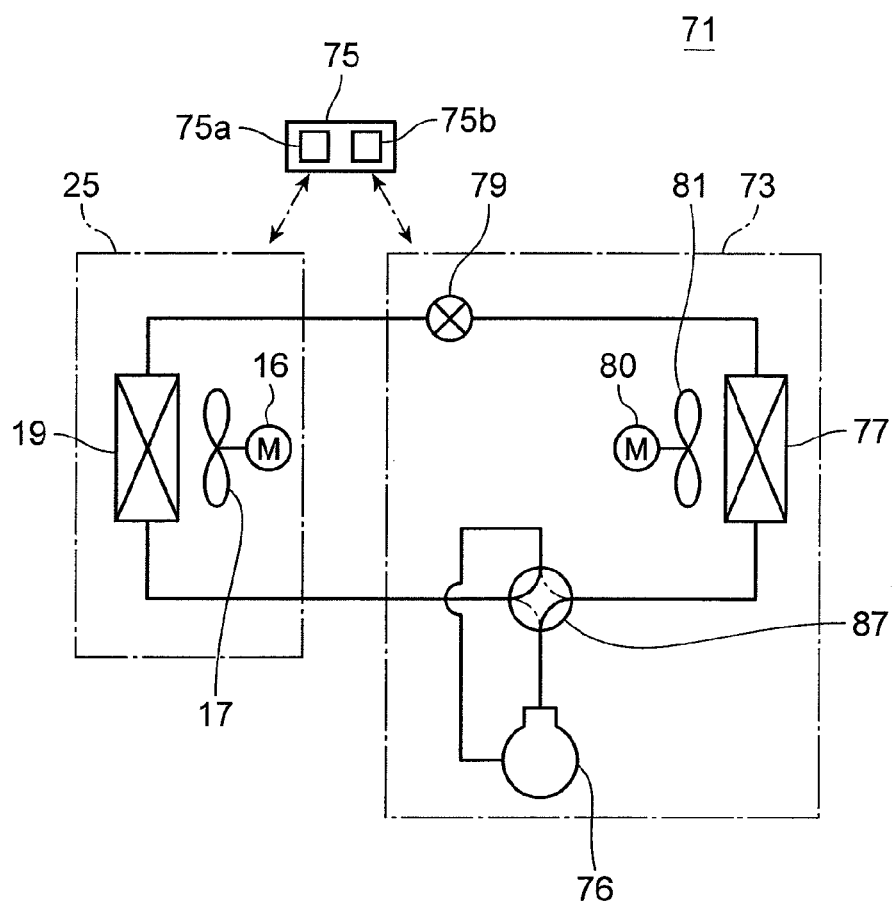
FIG. 1 is a configuration diagram illustrating the air-conditioning device according to one embodiment of the present invention.

As shown in FIG. 1, the air-conditioning device 71 according to this embodiment includes an indoor unit 25 and an outdoor unit 73. This air-conditioning device 71 forms a refrigerant circuit in which a refrigerant circulates, with a heat exchanger 19 disposed in the indoor unit 25, a compressor 76 disposed in the outdoor unit 73, a heat exchanger 77, and an expansion valve 79 connected to each other by piping. This air-conditioning device 71 can switch between cooling and heating operations by switching the flow direction of the refrigerant by means of a four-path switching valve 87 disposed in part of the piping of the refrigerant circuit.

The air-conditioning device 71 is controlled by a control unit 75. This control unit 75 includes an indoor control unit 75a controlling the operation of the indoor unit 25, and an outdoor control unit 75b controlling the operation of the outdoor unit 73. The control unit 75 is a microcomputer formed by a central processing unit (CPU), a memory, and the like (not shown).

The indoor unit 25 includes a motor 16 and a fan 17 driven to rotate by this motor 16. With this fan 17 rotating, air inside the indoor unit 25 is sent out into the room. The outdoor unit 73 includes a motor 80 and a fan 81 driven to rotate by this motor 80. With this fan 81 rotating, air inside the outdoor unit 73 is exhausted outdoors.

<Inverter Circuit>

Figure 2:
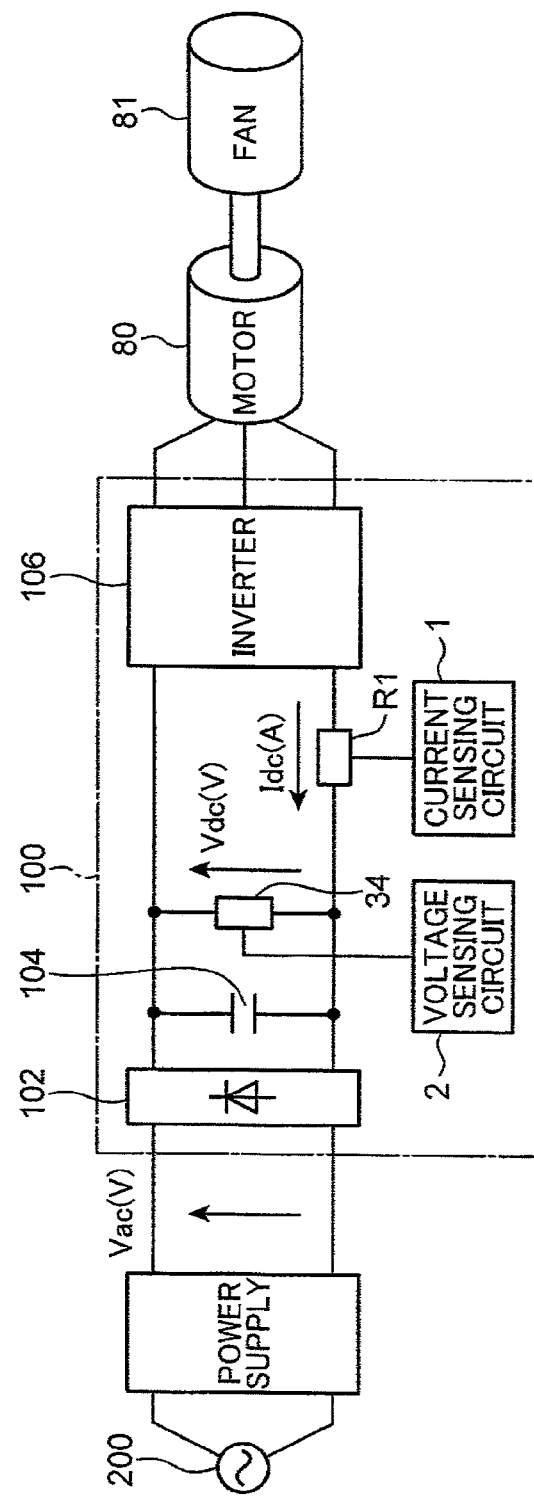
FIG. 2 is a circuit diagram illustrating an inverter circuit in which the current-sensing circuit according to one embodiment of the present invention is mounted.

FIG. 2 is a configuration diagram showing the configuration of the inverter circuit 100 including the current-sensing circuit 1 according to one embodiment of the present invention.

This inverter circuit 100 controls the drive of the motor 80 of the outdoor unit 73, which is the load of the circuit, using, for example, a commercial power supply 200. Alternating current (Vac) from the commercial power supply 200 is input to a converter unit 102 that employs a diode bridge and rectified to produce direct current. A smoothing capacitor 104 reduces pulsation (ripple) of the obtained direct current, and the voltage across the terminals of the smoothing capacitor 104 (Vdc) is applied to an inverter unit 106. The inverter unit 106 generates desired three-phase alternating current to drive the motor 80, by means of, for example, a semiconductor switching device such as an IGBT (Insulated Gate Bipolar Transistor).

In such an inverter circuit 100, a current-sensing circuit 1 and a voltage sensing circuit 2 are configured at suitable locations for the purposes of providing protection from over-current and over-voltage, respective detected values being input to the outdoor control unit 75b mentioned above. More specifically, a shunt resistor (current sensor) R1 of the current-sensing circuit 1 is connected as a current sensor in series with a current path between the converter unit 102 and the inverter unit 106, and a voltage sensor 34 included in the voltage sensing circuit 2 is connected in parallel with the smoothing capacitor 104. The current-sensing circuit 1 and the voltage sensing circuit 2 are powered by a DC power supply that is not shown. The current-sensing circuit 1 detects current. The voltage sensing circuit 2 detects voltage.

<Current-sensing Circuit>

Figure 3:
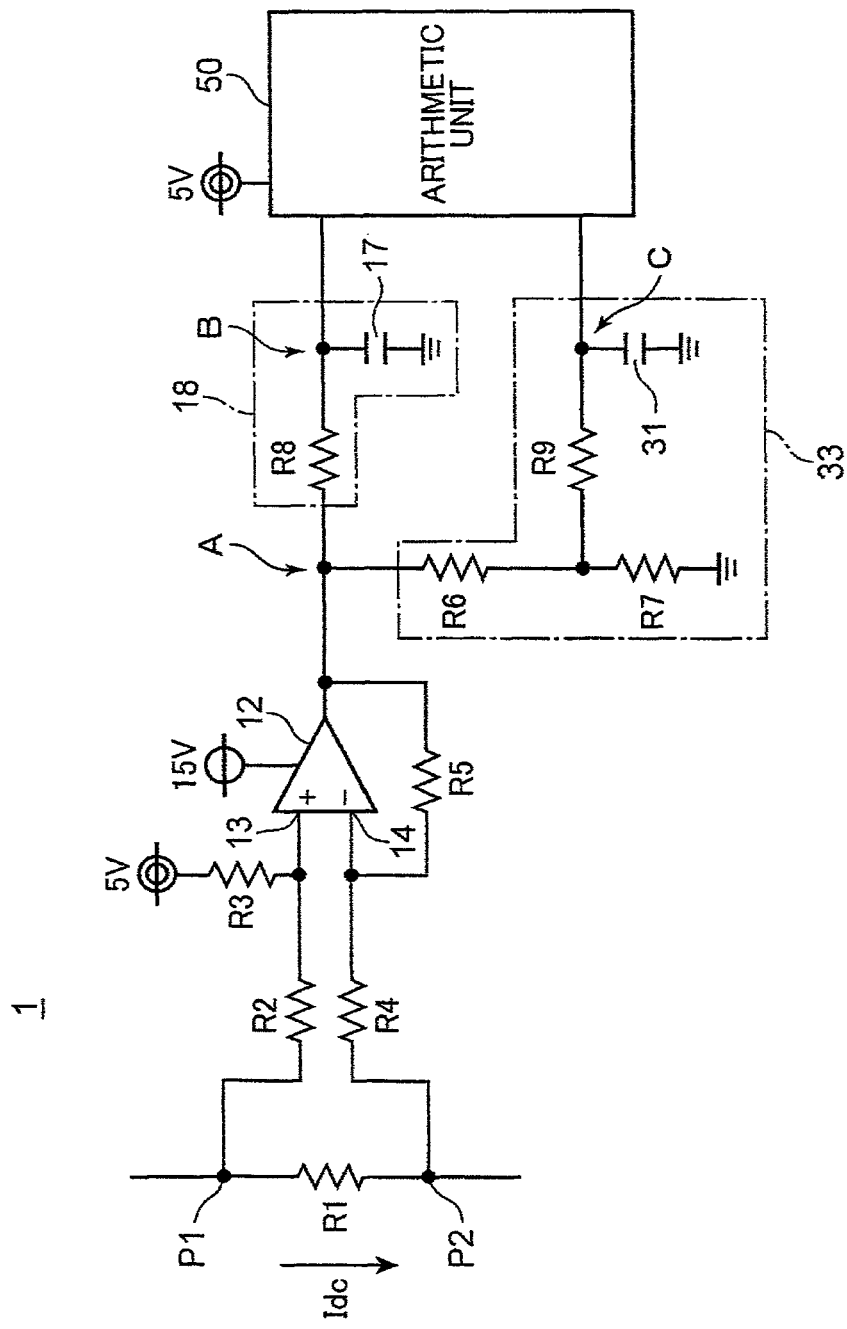
FIG. 3 is a circuit diagram illustrating the current-sensing circuit of FIG. 2.

FIG. 3 is a circuit diagram illustrating the current-sensing circuit 1 according to this embodiment. In this current-sensing circuit 1, an arithmetic unit 50 calculates the current value based on the electric potential across both ends of the shunt resistor R1. This arithmetic unit 50 is a microcomputer formed by a central processing unit (CPU), a memory, and the like. While this embodiment is described with one example in which this arithmetic unit 50 is provided separately from the control unit 75 mentioned above, the control unit 75 may serve the function of the arithmetic unit 50 in another embodiment.

The shunt resistor R1 is connected in series with the current path of the current Idc (A) between points P1 and P2, so that the voltage across the two points P1 and P2 is input to the operational amplifier 12. More specifically, voltage at point P1 on the high-voltage side of the shunt resistor R1 is input via an input resistor R2 to a positive input terminal 13 of the operational amplifier 12. Voltage at point P2 on the low-voltage side of the shunt resistor R1 is input via an input resistor R4 to a negative input terminal 14 of the operational amplifier 12. A feedback resistor R5 is connected between the output and the negative input terminal 14 of the operational amplifier 12. An offset voltage (5 V) is applied via a resistor R3 to the operational amplifier 12.

The operational amplifier 12 amplifies the current Idc flowing through the shunt resistor R1 with a gain G The output voltage amplified and output by the operational amplifier 12 is averaged at a low-pass filter (average voltage generating unit) 18 including a resistor R8 and a capacitor 17, while a high-frequency noise component is removed at the low-pass filter 18. This average voltage V1 is input to the arithmetic unit 50. The arithmetic unit 50 calculates the current value based on the input average voltage V1. This current value is determined as the current Idc flowing through the shunt resistor R1.

In this embodiment, the supply voltage of the operational amplifier 12 is set at 15 V, while the supply voltage of the arithmetic unit 50 is set at 5 V. Namely, the supply voltage of the operational amplifier 12 is set higher than the supply voltage of the arithmetic unit 50.

The current-sensing circuit 1 further includes a voltage dividing unit 33 connected in parallel with the low-pass filter 18 between the operational amplifier 12 and the arithmetic unit 50 as shown in FIG. 3. This voltage dividing unit 33 includes resistors R6, R7, and R9, and a capacitor 31. The resistors R6 and R7 are provided between point A and ground. The resistor R9 is provided on a path connecting a point between the resistors R6 and R7 and the arithmetic unit 50. The capacitor 31 is provided between point C on this path and ground. This voltage dividing unit 33 divides the output voltage of the operational amplifier 12 to make a peak value of the output voltage lower than the supply voltage (5 V) of the arithmetic unit 50.

<Operation>

The current-sensing circuit 1 of this embodiment is configured as described above, thereby to operate as follows, under the control of the arithmetic unit 50.

Figure 5A:
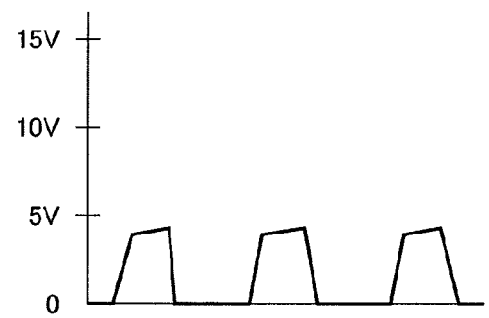
FIG. 5A is a graph showing output voltage of a conventional operational amplifier.
Figure 5B:
FIG. 5B is a graph showing average voltage obtained by averaging this output voltage.

First, for the purpose of comparison, the case wherein the supply voltages of the operational amplifier 12 and the arithmetic unit 50 are set the same will be described with reference to FIG. 5A and FIG. 5B. In this case, it is assumed that, when the value of the current flowing through the shunt resistor R1 is Idc (A), for example, the peak value of the output voltage at point A after this current is amplified and output by the operational amplifier 12 was, for example, 4.5 V, as shown in FIG. 5A. This output voltage is averaged by the low-pass filter 18, and this average voltage V2 is about 1.1 V, for example, as shown in FIG. 5B. This average voltage V2 is input to the arithmetic unit 50 for calculating the current value.

Figure 4A:
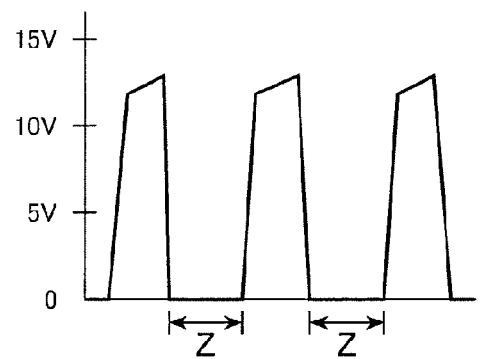
FIG. 4A is a graph showing voltage at point A in FIG. 3 (output voltage of the operational amplifier)
Figure 4B:
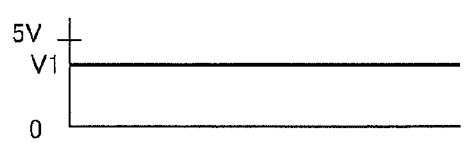
FIG. 4B is a graph showing voltage at point B in FIG. 3 (average voltage).

On the other hand, in this embodiment, the supply voltage of the operational amplifier 12 is set at 15 V, while the supply voltage of the arithmetic unit 50 is set at 5 V. In this case, it is assumed that, when the value of the current flowing through the shunt resistor R1 is Idc (A), for example, as with the case described above, the peak value of the output voltage at point A after this current is amplified and output by the operational amplifier 12 is, for example, about 13.5 V, as shown in FIG. 4A. This output voltage is averaged by the low-pass filter 18, and this average voltage V1 is about 3.3 V, for example, as shown in FIG. 4B.

As described above, with this embodiment, by setting the supply voltage of the operational amplifier 12 higher than the supply voltage of the arithmetic unit 50, the average voltage can be made higher (about three times higher with this embodiment) as compared to the case where the value of the supply voltage of the operational amplifier 12 and the value of the supply voltage of the arithmetic unit 50 are set the same.

Note, the average voltage V1 input to the arithmetic unit 50 needs to be lower than the supply voltage of the arithmetic unit 50. To achieve this, for example, the resistance of the operational amplifier 12 may be adjusted in consideration of the maximum value of the current Idc flowing through the shunt resistor R1.

The output voltage of the operational amplifier 12 is divided at the voltage dividing unit 33. The peak value of the divided output voltage becomes equal to or lower than 5 V, which is the supply voltage of the arithmetic unit 50. This output voltage is a pulse wave and input to the arithmetic unit 50. The ratio of voltage reduced by voltage division at the voltage dividing unit 33 may be changed by adjusting the resistance of the resistors R6 and R7.

As described above, according to the embodiment described above, average voltage V1 averaged at the low-pass filter 18 is input to the arithmetic unit 50, so that, as compared to a case where arithmetic operation is performed with pulse-wave output voltage being input to the arithmetic unit 50, a more inexpensive arithmetic unit 50 can be employed. Moreover, in the embodiment described above, the supply voltage of the operational amplifier 12 is set higher than the supply voltage of the arithmetic unit 50, and with the output voltage of the operational amplifier 12 being averaged at the low-pass filter 18 to a lower value than the supply voltage of the arithmetic unit 50, the average voltage V1 may be made as high as possible within the operable range of the arithmetic unit 50 to make the average voltage V1 closer to the supply voltage of the arithmetic unit 50. This can reduce errors in the current value calculated at the arithmetic unit 50, so that current sensing accuracy can be improved.

Since the embodiment described above further includes the voltage dividing unit 33 that divides the output voltage of the operational amplifier 12 and makes the peak value thereof lower than the supply voltage of the arithmetic unit 50, voltage data of a pulse wave with the peak value being made lower than the supply voltage of the arithmetic unit 50 by voltage division can be input to the arithmetic unit 50. Since voltage data of a pulse wave can be input to the arithmetic unit 50 as well as the average voltage V1 described above, a zero vector region Z of the pulse wave can also be detected. Detecting this zero vector region Z provides a merit of, for example, enabling detection of offset errors.

Further, in the embodiment described above, the air-conditioning device 71 includes the inverter circuit 100 including the current-sensing circuit 1, the motor 80 driven by this inverter circuit 100, and the fan 81 driven to rotate by this motor 80, so that control of the amount of air sent from the fan 81 driven to rotate by the motor 80 can be performed precisely.

According to the present invention, the following current-sensing circuit is provided:

(1) The current-sensing circuit of the present invention is a circuit for sensing current from an inverter. This current-sensing circuit includes a shunt resistor connected in series with a path of current from the inverter, an operational amplifier amplifying voltage across both ends of the shunt resistor with a predetermined gain, an average voltage generating unit averaging output voltage of the operational amplifier to generate an average voltage, and an arithmetic unit calculating the current flowing through the path based on the average voltage output from the average voltage generating unit. The supply voltage of the operational amplifier is set higher than the supply voltage of the arithmetic unit. The output voltage of the operational amplifier is averaged at the average voltage generating unit to a lower value than the supply voltage of the arithmetic unit.

With this configuration, average voltage averaged at the average voltage generating unit is input to the arithmetic unit, so that, as compared to a case where arithmetic operation is performed with pulse-wave output voltage being input to the arithmetic unit, a more inexpensive arithmetic unit can be employed. Moreover, in this configuration, the supply voltage of the operational amplifier is set higher than the supply voltage of the arithmetic unit, and with the output voltage of the operational amplifier being averaged at the average voltage generating unit to a lower value than the supply voltage of the arithmetic unit, the average voltage may be made as high as possible within the operable range of the arithmetic unit to make the average voltage closer to the supply voltage of the arithmetic unit. This can reduce errors in the current value calculated at the arithmetic unit, so that current sensing accuracy can be improved. The reason is as follows:

The average voltage obtained by averaging the output voltage of the operational amplifier is lower than the peak value of the output voltage before it is averaged. A current value calculated by the arithmetic unit from such a low average voltage will include large errors as mentioned above, resulting in poor current sensing accuracy. Therefore, in the configuration of the present invention, the supply voltage of the operational amplifier and the supply voltage of the arithmetic unit are set different on purpose in order to prevent the current sensing accuracy from being lowered. Namely, in the configuration of the present invention, the supply voltage of the operational amplifier is set higher than the supply voltage of the arithmetic unit so as to make the output voltage of the operational amplifier high. Thereby, the average voltage after being averaged at the average voltage generating unit is higher as compared to the case in which the supply voltage of the operational amplifier and the supply voltage of the arithmetic unit are set the same. Since the output voltage of the operational amplifier is averaged at the average voltage generating unit to a lower value than the supply voltage of the arithmetic unit, it is possible for the arithmetic unit to calculate using this average voltage.

For the reasons described above, the configuration of the present invention can provide an inexpensive current-sensing circuit with high current sensing accuracy.

(2) In a preferred embodiment of the present invention, the current-sensing circuit may further include a voltage dividing unit connected in parallel with the average voltage generating unit between the operational amplifier and the arithmetic unit to divide the output voltage of the operational amplifier to make a peak value of the output voltage lower than the supply voltage of the arithmetic unit.

With this configuration, since the circuit further includes a voltage dividing unit that divides the output voltage of the operational amplifier to make the peak value of the output voltage lower than the supply voltage of the arithmetic unit, voltage data of a pulse wave having a peak value that was made lower than the supply voltage of the arithmetic unit by voltage division can be input to the arithmetic unit. Since voltage data of a pulse wave can be input to the arithmetic unit as well as the average voltage described above, a zero vector region of the pulse wave can also be detected. Detecting this zero vector region provides a merit of, for example, enabling detection of offset errors.

(3) The air-conditioning device of the present invention includes an inverter circuit including the current-sensing circuit described above, a motor driven by the inverter circuit, and a fan driven to rotate by the motor.

With this configuration, the motor is driven by the inverter circuit including the current-sensing circuit with high current sensing accuracy, so that the amount of air sent from the fan driven to rotate by the motor can be controlled highly precisely.

The present invention is not restricted to the above embodiment and may be variously changed and modified without departing from the scope thereof.

For example, while the embodiment above has been described with one example in which the current-sensing circuit 1 detects current of the motor 80 of the outdoor unit 73, the current-sensing circuit 1 may be used for sensing current of the motor 16 of the indoor unit 25.

Also, while the embodiment above has been described with one example in which the supply voltage of the operational amplifier 12 is set at 15 V and the supply voltage of the arithmetic unit 50 is set at 5 V, the supply voltages should not be restricted to the respective figures given above, as long as the supply voltage of the operational amplifier 12 is set higher than the supply voltage of the arithmetic unit 50.

Also, while the embodiment above has been described with one example in which the current-sensing circuit 1 includes the voltage dividing unit 33, this voltage dividing unit 33 need not necessarily be provided in the current-sensing circuit 1.

EXPLANATION OF REFERENCE NUMERALS

1 current-sensing circuit
12 operational amplifier
18 average voltage generating unit
25 indoor unit
33 voltage dividing unit 50 arithmetic unit
71 air-conditioning device
73 outdoor unit
80 motor
81 fan
100 inverter circuit
106 inverter unit
R1 shunt resistor
R2 to R9 resistor

The invention claimed is:

1. A current-sensing circuit for sensing current from an inverter, comprising:
- a shunt resistor connected in series with a path of the current from the inverter;
- an operational amplifier amplifying voltage across both ends of the shunt resistor with a predetermined gain;
- an average voltage generating unit averaging output voltage of the operational amplifier to generate an average voltage; and
- an arithmetic unit calculating the current flowing through the path based on the average voltage output from the average voltage generating unit,
- wherein a supply voltage of the operational amplifier is set higher than a supply voltage of the arithmetic unit, and the output voltage of the operational amplifier is averaged at the average voltage generating unit to a lower value than the supply voltage of the arithmetic unit.

2. The current-sensing circuit according to claim 1, further comprising a voltage dividing unit connected in parallel with the average voltage generating unit between the operational amplifier and the arithmetic unit to divide the output voltage of the operational amplifier to make a peak value of the output voltage lower than the supply voltage of the arithmetic unit.

3. An air-conditioning device comprising:
- an inverter circuit including the current-sensing circuit according to claim 1;
- a motor driven by the inverter circuit; and
- a fan driven to rotate by the motor.

4. An air-conditioning device comprising:
- an inverter circuit including the current-sensing circuit according to claim 2;
- a motor driven by the inverter circuit; and
- a fan driven to rotate by the motor.

* * * * *